United States Patent
Réblewski et al.

(10) Patent No.: US 7,568,136 B2
(45) Date of Patent: Jul. 28, 2009

(54) RECONFIGURABLE SYSTEM AND METHOD WITH CORRUPTION DETECTION AND RECOVERY

(75) Inventors: Frédéric Réblewski, Paris (FR); Olivier V. Lepape, Paris (FR)

(73) Assignee: M2000 SA., Bievres (FR)

( * ) Notice: Subject to any disclaimer, the term of this patent is extended or adjusted under 35 U.S.C. 154(b) by 468 days.

(21) Appl. No.: 11/268,933

(22) Filed: Nov. 8, 2005

(65) Prior Publication Data
US 2007/0168718 A1    Jul. 19, 2007

(51) Int. Cl.
G01R 31/28    (2006.01)
(52) U.S. Cl. .................................................. 714/725
(58) Field of Classification Search ................. 714/725
See application file for complete search history.

(56) References Cited

U.S. PATENT DOCUMENTS

| | | | |
|---|---|---|---|
| 5,864,656 A | 1/1999 | Park | |
| 6,101,624 A | 8/2000 | Cheng | |
| 6,104,211 A | 8/2000 | Alfke | |
| 6,553,523 B1 * | 4/2003 | Lindholm et al. | 714/725 |
| 6,665,817 B1 * | 12/2003 | Rieken | 714/30 |
| 6,838,899 B2 * | 1/2005 | Plants | 326/9 |
| 6,968,487 B1 * | 11/2005 | Bryant et al. | 714/726 |
| 7,036,059 B1 * | 4/2006 | Carmichael et al. | 714/725 |
| 7,111,224 B1 * | 9/2006 | Trimberger | 714/764 |
| 7,200,235 B1 * | 4/2007 | Trimberger | 380/277 |
| 7,310,757 B2 * | 12/2007 | Ngo et al. | 714/725 |
| 7,328,384 B1 * | 2/2008 | Kulkarni et al. | 714/725 |
| 2002/0124206 A1 | 9/2002 | Frisch | |
| 2003/0097628 A1 | 5/2003 | Ngo | |
| 2003/0217310 A1 | 11/2003 | Ebsen | |
| 2004/0124876 A1 | 7/2004 | Plants | |
| 2006/0117234 A1 * | 6/2006 | Miyake et al. | 714/725 |

FOREIGN PATENT DOCUMENTS

| | | |
|---|---|---|
| EP | 1237080 A1 | 4/2002 |
| GB | 1263969 | 5/1969 |

OTHER PUBLICATIONS

Carl Carmichael: Correcting Single-Event Upsets Through Virtex Partial Configuration; Xilinx Application Note216; XP002358722 retrieved from the Internet; URL:http://direct.xilinx.com/bvdocs/appnotes/xapp216.pdf>; Jun. 2000; pp. 1-12.
Capt. Charles A. Hulme: Configurable Fault-Tolerant Processor (CFTP) For Spacecraft Onboard Processing; 2004 IEEE Aerospace Conference Proceedings; 2004; pp. 2269-2276.
International Search Report and Written Opinion mailed May 13, 2008 for PCT/EP2006/010610.
International Preliminary Report on Patentability mailed Jun. 5, 2008 for PCT/EP2006/010610.

* cited by examiner

*Primary Examiner*—James C Kerveros
(74) *Attorney, Agent, or Firm*—Schwabe, Williamson & Wyatt P.C.

(57) ABSTRACT

Reconfigurable circuits and systems having a recovery module coupled to the reconfigurable circuit and configured to access the configuration memory to retrieve configuration data stored in the configuration memory. The recovery module analyzes the retrieved configuration data to determine whether the configuration data has been corrupted and, if so, restores the configuration data to their uncorrupted state. Methods of operating such reconfigurable circuits and systems are also described.

27 Claims, 3 Drawing Sheets

100

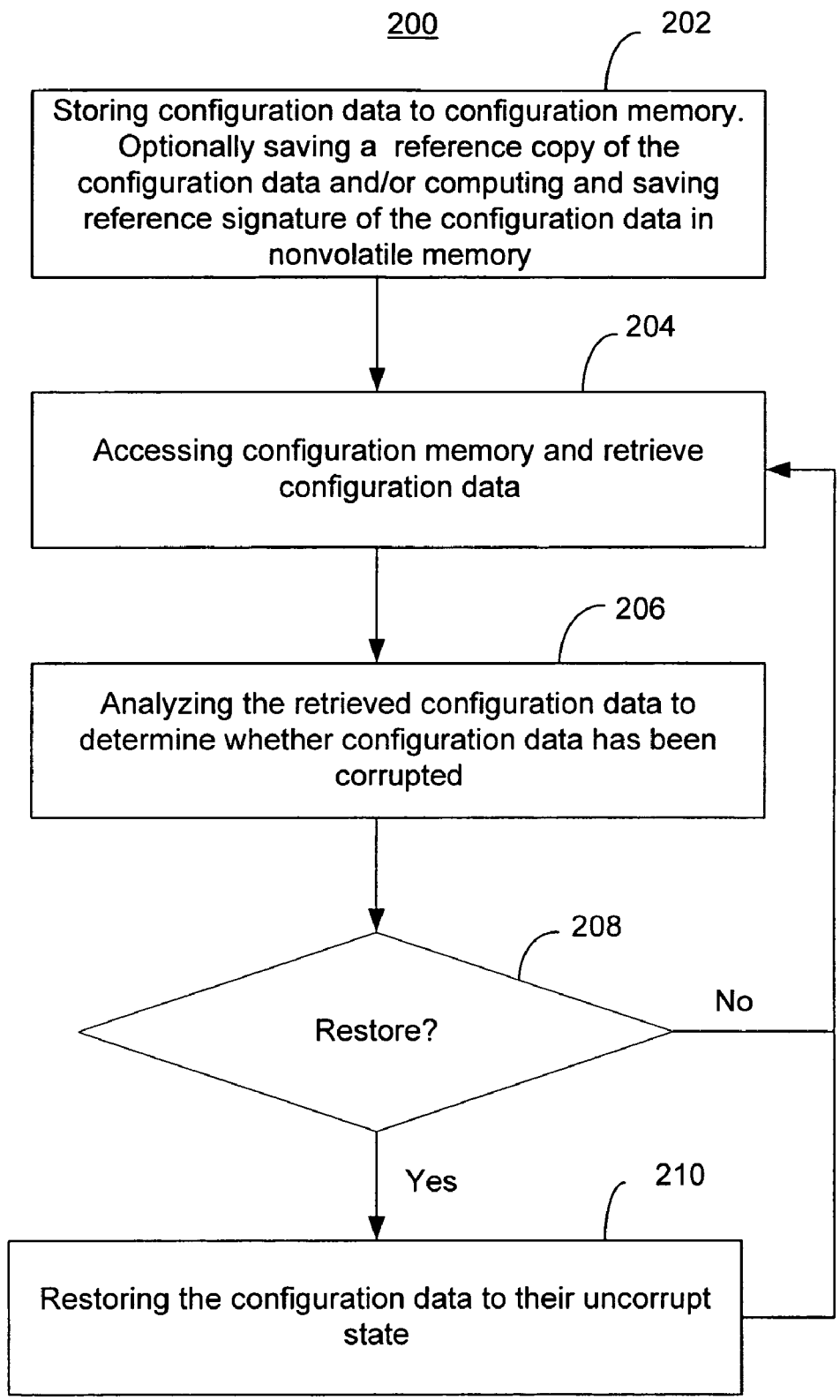

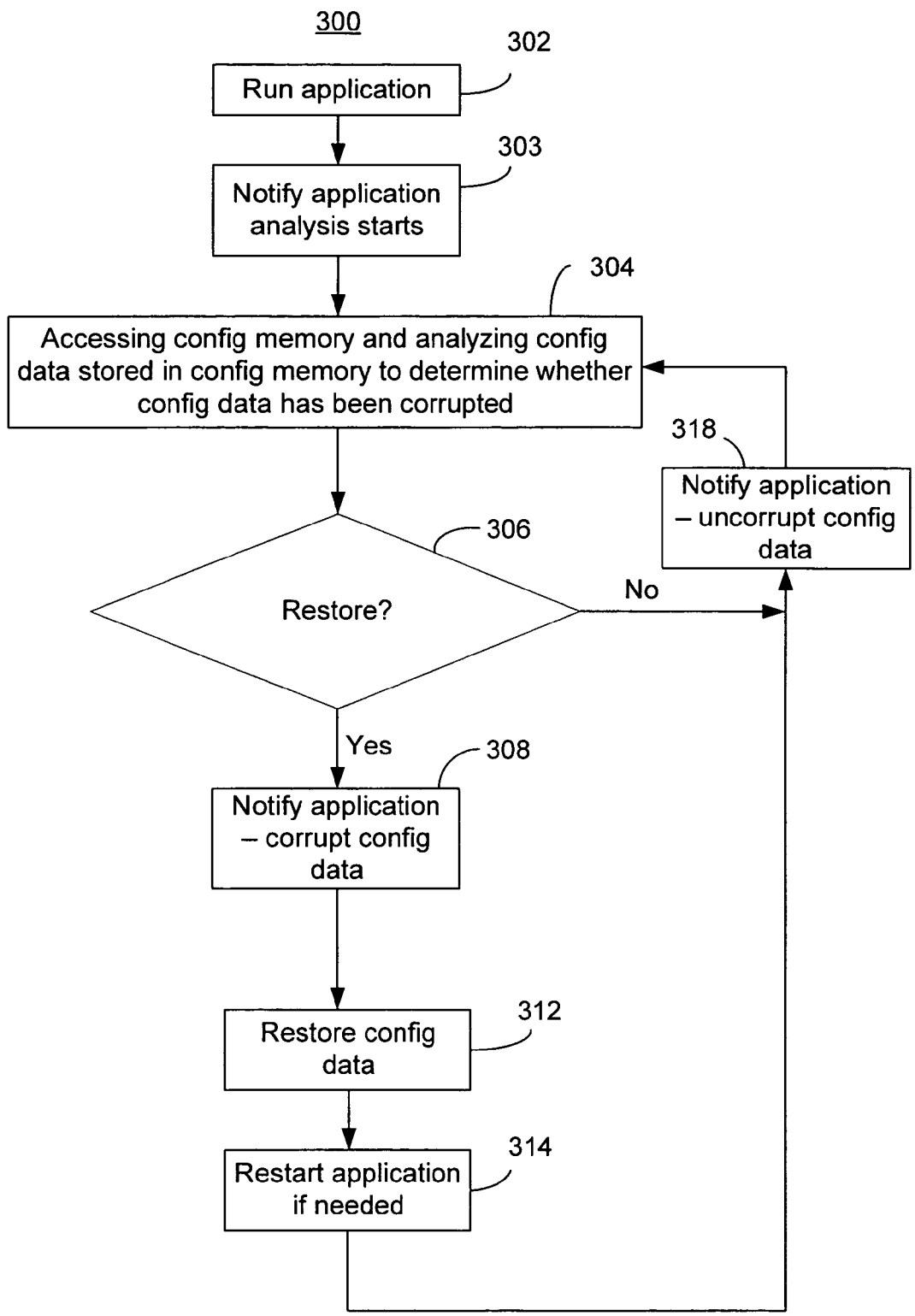

RECONFIGURABLE SYSTEM AND METHOD WITH CORRUPTION DETECTION AND RECOVERY

TECHNICAL FIELD

The present invention relates to the field of reconfigurable circuits. More specifically, the present invention relates to detection of errors in configuration memory of reconfigurable circuits and corrections of such errors.

BACKGROUND

In the current state of integrated circuit technology, reconfigurable circuits such as those that include Field Programmable Gate Arrays (FPGAs) have become valuable tools when used in various applications. For example, reconfigurable circuits have been widely used as essential components of emulation systems. Emulation systems are typically used as, for example, prototypes for circuits such as an Application Specific Integrated Circuit (ASIC). That is, rather than building a prototype of an ASIC during the design stages, which can be very expensive, an emulation system can be used instead to emulate the ASIC to be built. And because of their flexibility, reconfigurable circuits are not limited to ASIC prototyping but are used in other applications such as digital signal processing (DSP), medical imaging, computer vision, speech recognition, and so forth.

Reconfigurable circuits typically include a number of reconfigurable function blocks (or functions) that may be programmed and configured to behave and perform a variety of functions. The reconfigurable circuits will also typically include a number of reconfigurable interconnects (e.g., crossbar devices) that can be programmed to, among other things, selectively interconnect the input/outputs of the reconfigurable function blocks.

Although reconfigurable circuits have become valuable tools in some applications, such devices have been less useful in other applications. For example, the use of reconfigurable circuits in aviation, military, and space applications have been somewhat limited because reconfigurable circuits typically do not have sufficient robustness in dealing with, for example, Single Event Upset (SEU). SEUs are situations where a logic bit is flipped somewhere in a circuit as a result of, for example, a strike of a cosmic particle or in the presence of a radioactive material in the vicinity of the circuit.

To deal with such situations, circuits to be used in aviation, military, and space applications are designed to typically contain redundant logic and detection circuitry to detect the occurrence of SEUs. Optionally, such circuits may contain recovery circuitry that allows the application to go on even upon the occurrence of SEUs. Such techniques, however, cannot be used to detect and correct errors caused by SEUs in reconfigurable circuits. That is, such techniques cannot be used at the application level, i.e., by programming the reconfigurable circuit with the same redundant logic design that would have been used for a circuit design because an SEU that occurs in the configuration memory will change the function of the logic gates at the application level, which is not a kind of fault that an SEU robust design can deal with.

Accordingly, a reconfigurable circuit system that is able to detect the occurrence of errors such as those associated with SEUs and that can recover from such errors is desirable.

BRIEF DESCRIPTION OF THE DRAWINGS

The present invention will be described by way of exemplary embodiment, but not limitations, illustrated in the accompanying drawings in which like references to note similar elements, and in which:

FIG. 2 illustrates a process for detecting corrupt configuration data in a configuration memory of a reconfigurable circuit and restoring the configuration data to their uncorrupt state in accordance with various embodiments; and FIG. 3 illustrates a process for implementing an application using a reconfigurable circuit while a process for detecting and correcting corrupt configuration data in the configuration memory of the reconfigurable circuit is being performed in accordance with various embodiments.

DETAILED DESCRIPTION

Figure 1:
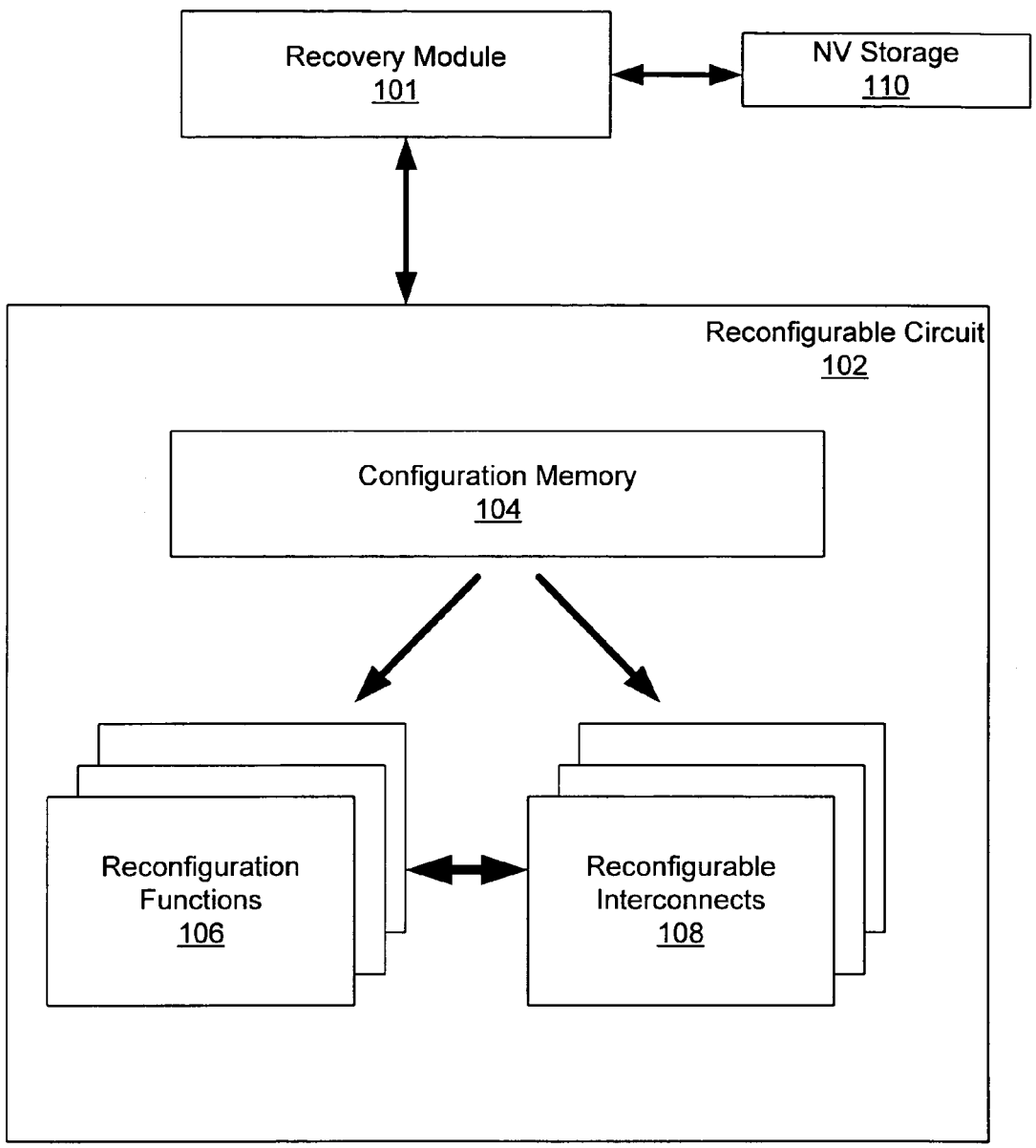
FIG. 1 illustrates a block diagram of an exemplary reconfigurable system that includes a recovery module in accordance with various embodiments of the present invention.

In the following description, for purposes of explanation, specific numbers, materials, and configurations are set forth in order to provide a thorough understanding of the present invention. However, it will be apparent to one skilled in the art that the present invention may be practiced without the specific details. In other instances, well-known features are omitted or simplified in order not to obscure the present invention.

Reference in the specification to "various embodiments" or "some embodiments" means that a particular feature, structure, or characteristic described in connection with the embodiments are included in at least one embodiment of the invention. The appearances of the phrase "in various embodiments" in various places in the specification do not necessarily all refer to the same embodiments, although they may.

FIG. 1 is a block diagram depicting an exemplary reconfigurable system 100 including a recovery module in accordance with various embodiments of the invention. For the various embodiments, as illustrated, the reconfigurable system 100 includes a non-volatile storage 110, a recovery module 101, and a reconfigurable circuit 102, coupled to each other as shown. For these embodiments, the nonvolatile storage 110 is employed to store a reference copy of the configuration data stored in the configuration memory 104 of reconfigurable circuit 102, when it is configured to run an application. The reconfigurable circuit 102, in addition to configuration memory 104, includes reconfiguration function blocks (herein "functions") 106, and reconfigurable interconnects (herein "interconnects") 108, coupled to each other as shown. Note that although not depicted, additional components such as input/output pins, nonreconfigurable functions, and interconnects may also be included in the reconfigurable circuit 102. Nonreconfigurable functions that may be included include, for example, processor core, memory controller, bus bridges, and the like.

The functions 106, in various embodiments, are programmable circuit devices that are reconfigurable to perform a variety of functions. For these embodiments, the functions 106 may be any type of reconfigurable circuitry similar to or the same as those found in programmable logic devices (PLDs) or FPGAs, reconfigurable to support alternate functions. The functions 106 represent a broad category of functional blocks that are well known and therefore will not be further described.

Coupled to the functions 106 are reconfigurable interconnects (herein "interconnects") 108 that are also programmable and that may selectively route signals between the functions 106 as well as routing external input/output signals to and from the functions 106. In some embodiments, the reconfigurable interconnects 108 may be programmable crossbar devices or other types of switching devices. Crossbar devices that may be used include a fully populated crossbar or any device having crossbar device architecture such as pass transistor bidirectional crossbar devices or wired or unidirectional crossbar devices or buffered unidirectional crossbar devices. Both the reconfigurable functions 106 and the interconnects 108 may include dedicated input pins for receiving configuration data used to configure the functions 106 and the interconnects 108.

The configuration memory 104 is directly or indirectly coupled to the functions 106 and the interconnects 108. In various embodiments, as described earlier, the configuration memory 104 may store configuration data used to configure the reconfigurable functions 106 and interconnects 108. In some embodiments, the configuration memory 104 may be structured as a looped back shift register. In other embodiments, however, the configuration memory 104 may be structured as either a shadow shift register or a static random access memory (SRAM). In still other embodiments, the configuration memory 104 may have other structures.

The recovery module 101, among other things, is adapted to analyze and determine whether the configuration data stored in the configuration memory 104 is corrupt or uncorrupt. The corruption of the configuration data stored in the configuration memory 104 may be as a result of, for example, an SEU. In brief, the determination by the recovery module 101 as to whether the configuration data stored in the configuration memory 104 has been corrupted may involve the recovery module 101 initially accessing the configuration memory 104 to retrieve the configuration data stored in the configuration memory 104. Note that the word "retrieved" is broadly defined herein and may mean actual retrieval, copying, reading, and so forth, of the configuration data stored in the configuration memory 104. Upon retrieving the configuration data, the recovery module 101 may analyze the retrieved configuration data to determine whether the configuration data has been corrupted. If it is determined that the configuration data has indeed been corrupted, the recovery module 101 may restore or may facilitate the restoration of the configuration data in the configuration memory 104 to an uncorrupt state. In various embodiments, the recovery module 101 may include a processor, a controller, or other such devices capable of executing a set of instructions designed to detect corrupt configuration data and to restore such data, among other things, as described herein.

A more detailed explanation of how the recovery module 101 may detect corrupt configuration data and restore such data follows. To determine whether the configuration data stored in the configuration memory 104 is corrupted, the recovery module 101, in addition to accessing the configuration memory 104, may also access the nonvolatile storage 110. The nonvolatile storage 110 contains a "reference copy" of the uncorrupted configuration data that was initially stored in the configuration memory 104, which is inherently immune to SEUs.

In various embodiments, the recovery module 101 may analyze and determine whether the configuration data stored in the configuration memory 104 is corrupt by performing a bit-by-bit comparison of the configuration data retrieved from the configuration memory 104 with the reference configuration data stored in the nonvolatile storage 110. In some embodiments, the recovery module 101 may perform the analysis and determination by computing both a current configuration signature based on the configuration data retrieved from the configuration memory 104 and a reference configuration signature based on the reference configuration data stored in the nonvolatile storage 110, and comparing the computed current and reference configuration signatures.

The reference configuration signature may also be stored in the nonvolatile storage 110 rather than computing it based on the configuration data stored in the nonvolatile storage 110. This allows the design to be protected against corruption of the nonvolatile storage 110, which, although it is immune to SEUs, can occur for various other reasons.

If a determination is made that the current or latest configuration data stored in the configuration memory 104 is corrupt then the recovery module 101 may conditionally restore the configuration data stored in the configuration memory 104. The restoration of the configuration data stored in the configuration memory 104 may be performed in a number of different ways. In some embodiments, this may be accomplished, for example, by performing memory writes. For example, this may involve reloading the configuration memory with the reference configuration data stored in the nonvolatile storage 110. Alternatively, if the way the signature is computed allows for identifying the faulty bit in case of single bit error, and there is only a single bit error then the faulty bit may be flipped if the configuration memory 104 is capable of random access. In various embodiments, the above process of detecting corrupt configuration data and restoring the configuration data stored in the configuration memory 104 may be performed randomly, periodically, or continuously.

After the reconfigurable circuit 102 has been configured in accordance with the configuration data, the configured reconfigurable circuit 102 may be used to implement an application that may or may not have been specifically designed to be run on the configured reconfigurable circuit 102. During the implementation of an application, the reconfigurable circuit 102 based on the configuration data may be configured or programmed to be able to perform the various functions that may be needed to implement the application.

When an application is being implemented using the reconfigurable circuit 102, the recovery module 101 may or may not be able to perform some of its functions immediately as described above depending upon, for example, the structure of the configuration memory 104. For example, in some embodiments, the configuration memory 104 may be structured as a looped back shift register; in which case, the recovery module 101 will not be able to perform its function of retrieving and restoring the configuration data stored in the configuration memory 104 until the application has stopped running. In such embodiments, the recovery module 101 may stop the application or may just wait until the application has stopped running before performing these functions. In other embodiments, however, the recovery module 101 may be able to perform all of its functions including retrieving and restoring configuration data stored in the configuration memory 104 while the application is running. This is the case, for example, when the configuration memory 104 is structured as a shadow shift register or a static random access memory (SRAM).

In some embodiments, once the recovery module 101 has made a determination as to whether the configuration data stored in the configuration memory 104 is corrupt or not corrupt, the recovery module 101 may or may not notify the application of the status (i.e., corrupt or not corrupt) of the configuration data stored in the configuration memory 104. That is, in some embodiments, if the recovery module 101 determines that the configuration data is corrupt then the recovery module 101 may notify the application that the configuration data is corrupt. In other embodiments, however, no such notification may be provided to the application. Similarly, if the recovery module determines that the configuration data is uncorrupt, then the recovery module 101 may notify the application that the configuration data is uncorrupt. In other embodiments, however, no such notification may be provided to the application. In yet other embodiments, the recovery module 101 may notify the application at the beginning of the analysis process that the analysis is about to begin. This allows the application to checkpoint its own state and consider it as a valid fall back state if the configuration memory 104 is finally determined as uncorrupt. In the opposite case, that is if the configuration memory 104 is finally determined as corrupt, the previous checkpoint can be used to restart the application.

Upon detecting one or more errors in the configuration data stored in the configuration memory 104, the recovery module 101 may wait for the application to stop, if the application is running, before restoring the configuration data stored in the configuration memory 104. That is, the restoration process of the configuration data stored in the configuration memory 104 may be delayed until the application is in a steady state or has stopped. Once the restoration is completed, the recovery module 101 may notify the application the uncorrupt state of the configuration data.

In some embodiments, the application to be implemented using the reconfigurable circuit 102 may include an application memory. For these embodiments, the application memory may be configured to be protected by one or more parity bits that cause the application to restart on an occurrence of a parity error. That is, after such an application is implemented, upon occurrence of a parity error, the application will be restarted from the beginning or from a valid checkpoint.

In some embodiments, the application to be implemented using the reconfigurable circuit 102 may include an application register. For these embodiments, the application register may have one or more register bits, with at least one of the register bits having a redundant copy of the register bit. Logic may be coupled to the register bit and the redundant copy, the logic causing the application to restart, from the beginning or from a valid checkpoint, on a mismatch of the register bit and the redundant copy.

Before proceeding to further describe the various embodiments of the present invention, it should be noted that while for ease of understanding, only one each of reconfigurable circuit 102, recovery module 101, and non-volatile storage 110 is illustrated in FIG. 1, in alternate embodiments, the invention may be practiced with one or more of each of these elements (or none, in the case of non-volatile storage 110), i.e. with one or more reconfigurable circuits 102, supported by one or more recovery module 101, independently or cooperating with each other, using zero or more non-volatile storage 110. In case no nonvolatile memory 110 is used, the reference signature can either be provided to the recovery module 101 when the reconfigurable circuit 102 is initially configured or it can be computed by the recovery module on the fly while the reconfigurable circuit 102 is initially configured.

FIG. 2 depicts a process for detecting corrupt configuration data in a configuration memory of a reconfigurable circuit and restoring the configuration data to their uncorrupt state in accordance with various embodiments. As illustrated, for the embodiments, the process 200 may begin when the original uncorrupt configuration data is stored in the configuration memory 104 of the reconfigurable circuit 102 at 202. In various embodiments, operation 202 may also include saving a reference copy of the configuration data in non-volatile storage 110, if employed, and/or computing and saving a reference signature of the configuration data. In still other embodiments, operation 202 may include receiving a reference signature of the configuration data.

Next, at a later point in time, the configuration memory is accessed to retrieve the most current configuration data stored or contained in the configuration memory at 204. Note again that the word "retrieving" is broadly defined and may mean actual retrieval, copying, reading, and so forth, of the configuration data stored in the configuration memory. After retrieving the most current configuration data, the retrieved configuration data may be analyzed to determine whether the latest configuration data stored in the configuration memory has been corrupted at 206. The analysis of the latest configuration data may include performing a bit by bit comparison of the configuration data retrieved from the configuration memory with the reference configuration data stored in the nonvolatile storage. In some embodiments, a current signature may be computed while the configuration memory is being accessed. The current signature is then compared with a reference signature, either previously stored in the nonvolatile storage (i.e., dedicated memory) or computed when the configuration memory 104 was initially loaded, in order to determine the presence of errors in the latest configuration data stored in the configuration memory.

Based on the determination that the latest configuration data is or is not corrupt, a restoration of the configuration data may or may not be performed at 208. If the configuration data is not corrupt, the process 200 may return to 204 to again access the configuration memory to retrieve a more recent configuration data stored in the configuration memory and do another determination as to whether the more recent configuration data is corrupt. If, on the other hand, the configuration data is determined to be corrupt, the configuration data may be restored to their uncorrupt state at 210. Once restoration is completed, the configuration memory may be accessed again in order to retrieve a more recent configuration data stored in the configuration memory. Note that, in various embodiments, 204 to 210 may be repeated randomly, periodically, or continuously.

FIG. 3 depicts a process for implementing an application using a reconfigurable circuit while a process for detecting and correcting corrupt configuration data in the configuration memory of the reconfigurable circuit is being performed in accordance with various embodiments. For the embodiments, the process 300 may begin when an application to be implemented using a configured reconfigurable circuit is run on the configured reconfigurable circuit at 302. The configuration memory of the reconfigurable circuit may be accessed in order to retrieve the latest configuration data stored in the configuration memory, and the retrieved configuration data may be analyzed to determine whether the configuration data has been corrupted at 304. The specific details of the retrieval and analysis process of the configuration data will not be discussed here as they have already been previously described in reference to 204 and 206 of FIG. 2. Note that in some embodiments, the accessing and analysis of the configuration data stored in the configuration memory can be started prior to running the application.

In some embodiments, the accessing and retrieval of the configuration data from the configuration memory is accomplished while the application is not running or is stopped. This may be the case when, for example, when the configuration memory is structured as a looped back shift register. In such a situation, the accessing and retrieving may be performed by purposefully stopping the application or just waiting for the application to stop on its own. In other embodiments, the configuration data stored in the configuration memory may be accessed and retrieved in parallel with the application running. This may be the case, for example, when the configuration memory is structured either as a shadow shift register or a static random access memory (SRAM).

Before analyzing the configuration data at 304, the application may be notified at 303 that the analysis process is starting. In case the process finally determines that the configuration data is uncorrupt, this will allow the application to consider all operations executed before this notification as secure. After analyzing the configuration data at 304, a determination is made as to whether the configuration data stored in the configuration memory is or is not corrupt. Based on the determination that the latest configuration data is or is not corrupt, a restoration of the configuration data may or may not be performed at 306. If the configuration data stored in the configuration memory is found not to be corrupt, then the application may be notified that the configuration data is uncorrupt at 318. If, on the other hand, it is determined that the configuration data stored in the configuration memory is found to be corrupt, the application may be notified that the configuration data stored in the configuration memory is corrupt at 308. The configuration data stored in the configuration memory may then be restored at 312. In some embodiments, the restoration of the configuration data may occur only when the application is stopped. In such a case, the application may be purposefully stopped or the restoration taking place only when the application stops on its own or reaches a steady state. In other embodiments, however, the restoration of the configuration data can be performed in parallel with the application running.

In some embodiments, where the application was stopped in order to restore the configuration data stored in the configuration memory (e.g., the configuration memory is structured as a looped back shift register and the application was stopped in order to access, retrieve, and restore the configuration data), the application may be restarted at 314. In other embodiments, however, where the configuration data was restored in parallel with the application running (e.g., the configuration memory is structured as a shadow shift register or a static random access memory (SRAM) and the accessing, retrieving, and restoring of the configuration data can be performed in parallel with the application running), there may be no need to restart the application if the application is able to run with a faulty function for some time. Once the restoration of the configuration data stored in the configuration memory has been completed, the application may be notified that the configuration data is uncorrupt at 318. The process of accessing, analyzing, and restoring of the configuration data may then repeat itself again and again. Note that some of the procedures included in process 300 may be omitted or replaced by alternative procedures in various alternative embodiments. For example, 308 and/or 318 may be omitted in various alternative embodiments. Also, the notification 303 can be suppressed without loss of generality if the process is repeated continuously as it always occur just after the notification of 318 that the data is uncorrupt, except for the very first time, which is insignificant.

Although not depicted, in some embodiments, the process 300 may further include configuring the application to include an application memory that is protected by one or more parity bits that cause the application to restart on an occurrence of a parity error. In still other or the same embodiments, the process 300 may further include configuring the application to include an application register having one or more register bits, with at least one of the register bits having a redundant copy of the register bit, and logic coupled to the register bit and the redundant copy to cause the application to restart on a mismatch of the register bit and the redundant copy.

Although specific embodiments have been illustrated and described herein, it will be appreciated by those of ordinary skill in the art and others, that a wide variety of alternate and/or equivalent implementations may be substituted for the specific embodiments shown and described without departing from the scope of the present invention. This application is intended to cover any adaptations or variations of the embodiments discussed herein. Therefore, it is manifested and intended that the invention be limited only by the claims and the equivalents thereof.

What is claimed is:

1. A reconfigurable system comprising:
a reconfigurable circuit including a plurality of reconfiguration functions and reconfigurable interconnects coupled to the reconfiguration functions, and a configuration memory coupled to the reconfiguration functions and interconnects to store configuration data to configure the reconfiguration functions and interconnects; and
a recovery module coupled to the reconfigurable circuit, the recovery module to access the configuration memory to retrieve the configuration data stored in the configuration memory, analyze the retrieved configuration data to determine whether the retrieved configuration data has been corrupted, and restore the configuration data to their uncorrupted state.

2. The reconfigurable system of claim 1, wherein the configuration memory comprises a looped back shift register.

3. The reconfigurable system of claim 1, wherein the configuration memory comprises either a shadow shift register or a static random access memory.

4. The reconfigurable system of claim 1, wherein the system further comprises nonvolatile storage to store the configuration data provided to and stored in the configuration memory of the reconfigurable circuit.

5. The reconfigurable system of claim 4, wherein the recovery module is configured to perform said analysis to make said determination by performing a bit-by-bit comparison of the configuration data retrieved from the configuration memory of reconfigurable circuit with the configuration data stored in the non-volatile storage.

6. The reconfigurable system of claim 1, wherein the recovery module is configured to perform said analysis to make said determination by computing a current configuration signature based on the configuration data retrieved from the configuration memory of the reconfigurable circuit and storing a reference configuration signature and comparing the computed current and reference configuration signatures.

7. The reconfigurable system of claim 6 where the recovery module is configured to receive the reference signature at the same time that the configuration memory is configured.

8. The reconfigurable system of claim 6 where the recovery module is configured to compute the reference signature based on the configuration data that are initially loaded to the configuration memory.

9. The reconfigurable system of claim 1, wherein the recovery module is configured to perform said analysis and conditional restoration of the configuration data, either periodically or continuously.

10. The reconfigurable system of claim 1, wherein the recovery module is further configured to notify an application implemented using the reconfigurable circuit after a beginning of said analysis, after determining that the configuration data is uncorrupted, and/or after restoring the configuration data, to their uncorrupted state.

11. The reconfigurable system of claim 10, wherein the recovery module is further configured to notify the application that a configuration data analysis starts.

12. The reconfiguration system of claim 10, wherein the recovery module is further configured to notify the application of configuration data errors detected.

13. The reconfigurable system of claim 10, wherein the recovery module is configured to wait for the application to stop before restoring the configuration data to their uncorrupted state.

14. The reconfigurable system of claim 10, wherein the application includes an application memory configured to be protected by one or more parity bits that cause the application to restart on an occurrence of a parity error.

15. The reconfigurable system of claim 10, wherein the application includes an application register having one or more register bits, with at least one of the register bits having a redundant copy of the register bit, and logic coupled to the register bit and the redundant copy to cause the application to restart on a mismatch of the register bit and the redundant copy.

16. A method comprising:
  accessing a configuration memory of a reconfigurable circuit to retrieve configuration data stored in the configuration memory to configure a plurality of reconfiguration functions and interconnects of the reconfigurable circuit;
  analyzing the retrieved configuration data to determine whether the retrieved configuration data has been corrupted; and
  restoring the configuration data to their uncorrupted state on determining that the configuration data has been corrupted.

17. The method of claim 16, wherein the configuration memory comprises a looped back shift register, and the accessing and retrieving are performed by stopping an application implemented using the reconfigurable circuit, shifting the configuration data until each configuration bit comes back to its original place, and restarting the application.

18. The method of claim 16, wherein the configuration memory comprises either a shadow shift register or a static random access memory, and the accessing and retrieving are performed in parallel with an application running, the application implemented using the reconfigurable circuit.

19. The method of claim 16, wherein said analyzing comprises performing a bit-by-bit comparison of the configuration data retrieved from the configuration memory of reconfigurable circuit with the configuration data stored in the non-volatile storage.

20. The method of claim 16, wherein the method further comprises computing a current signature while the configuration memory is accessed and retrieved and comparing it with a previously-stored signature in a dedicated memory when the circuit was initially configured.

21. The method of claim 16, wherein said analysis and conditional restoration of the configuration data, are performed either periodically or continuously.

22. The method of claim 16, wherein the method further comprises notifying an application implemented using the reconfigurable circuit after a beginning of said analysis, after determining that the configuration data is uncorrupted, and/or after restoring the configuration data to their uncorrupted state.

23. The method of claim 22, wherein the method further comprises notifying an application implemented using the reconfigurable circuit before a beginning of said analysis.

24. The method of claim 22, further comprising notifying the application of configuration data errors detected.

25. The method of claim 22, wherein said restoring comprises waiting for the application to stop before restoring the configuration data to their uncorrupted state.

26. The method of claim 22, wherein the method further comprises configuring the application to include an application memory protected by one or more parity bits that cause the application to restart on an occurrence of a parity error.

27. The method of claim 22, wherein the method further comprises configuring the application to include an application register having one or more register bits, with at least one of the register bits having a redundant copy of the register bit, and logic coupled to the register bit and the redundant copy to cause the application to restart on a mismatch of the register bit and the redundant copy.

* * * * *